United States Patent
Fuertsch et al.

(10) Patent No.: US 7,025,163 B2
(45) Date of Patent: Apr. 11, 2006

(54) DEVICE FOR DETECTING A DEFORMATION OF A COMPONENT

(75) Inventors: Matthias Fuertsch, Gomaringen (DE); Gerd Lorenz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 274 days.

(21) Appl. No.: 10/311,919

(22) PCT Filed: Apr. 5, 2002

(86) PCT No.: PCT/DE02/01236
§ 371 (c)(1),
(2), (4) Date: Jul. 21, 2003

(87) PCT Pub. No.: WO02/083462
PCT Pub. Date: Oct. 24, 2002

(65) Prior Publication Data
US 2004/0099462 A1    May 27, 2004

(30) Foreign Application Priority Data
Apr. 18, 2001 (DE) ................. 101 18 780

(51) Int. Cl.
*B60K 28/10* (2006.01)
(52) U.S. Cl. ........................ 180/274; 340/436
(58) Field of Classification Search .............. 180/274; 280/735, 784; 340/436; 200/61.53, 83 R
See application file for complete search history.

(56) References Cited

U.S. PATENT DOCUMENTS

| 4,172,603 A | 10/1979 | St. Clair et al. |
| 4,209,185 A | 6/1980 | St. Clair et al. |
| 5,496,136 A * | 3/1996 | Egan ........................ 405/186 |
| 5,547,216 A | 8/1996 | Iwata et al. |
| 5,748,075 A * | 5/1998 | Dirmeyer et al. ........... 340/436 |
| 6,076,853 A * | 6/2000 | Stanley ...................... 280/735 |
| 6,708,560 B1 * | 3/2004 | Watanabe et al. ......... 73/204.22 |

FOREIGN PATENT DOCUMENTS

| DE | 41 15 202 | 11/1992 |
| DE | 195 04 353 | 9/1995 |
| DE | 198 58 760 | 6/2000 |

* cited by examiner

*Primary Examiner*—David R. Dunn
(74) *Attorney, Agent, or Firm*—Kenyon & Kenyon

(57) ABSTRACT

A device for detecting a deformation of a component, for example, in the automotive industry, having a deformable hollow body arrangement assigned as a deformation indicator to the component and having at least one orifice area, and at least one sensor device situated in the particular orifice area for measuring an air flow corresponding to the deformation of the hollow body arrangement. In addition, a method of detecting such a deformation of a component and activating an appropriate safety application is described. The measured data is analyzed by an analyzer unit after measurement of the deformation, and a suitable safety application optionally being activated if the measured data of the at least one sensor device indicates a deformation of hollow body arrangement and thus of the component.

28 Claims, 2 Drawing Sheets

DEVICE FOR DETECTING A DEFORMATION OF A COMPONENT

FIELD OF THE INVENTION

The present invention relates to a device and method for detecting a deformation of a component.

BACKGROUND INFORMATION

Although it is applicable to any desired components, the present invention as well as the problems on which it is based are explained here with respect to an automotive component.

To detect an accident or an impact involving a vehicle, sensors are conventionally installed in the vehicle. By analyzing the measurement results of these sensors, various vehicle occupant safety applications provided in the vehicle may be activated in case of need. Pressure sensors may be used in a part located on the side of the vehicle, e.g., a door of the vehicle for detecting a side impact.

German Patent No. 41 15 202 describes a method and a device for recognizing whether a seat in a vehicle is occupied by a person. A sensor is provided with which a container is filled with an incompressible free-flowing medium. The mass or volume of displaced medium can be detected by the sensor. German Patent Application No. 195 04 353 describes a deformation sensor which, when an internal pressure of a deformable box is detected by a pressure sensor, delivers an electric signal depending on the pressure thus detected.

With pressure sensors, certain types of interference may make reliable detection of an accident or crash highly difficult. For example, insufficient sealing in the door structure may cause additional pressure fluctuations which have a negative effect on the measurement accuracy of pressure sensors.

Likewise, in the event of an accident, there may be severe damage to the corresponding vehicle part in which the pressure sensor is installed, and thus inaccurate measurement results may be obtained or there may even be a system failure.

Slamming of a vehicle door or a trunk lid may cause a sudden pressure increase inside the vehicle, so that a faulty signal is delivered for deployment of a vehicle occupant safety application.

In addition, the pressure sensors detect only a limited area, and it is difficult to adapt them to the prevailing geometric design of the corresponding component.

SUMMARY OF THE INVENTION

An object of the present invention may include, in general, creating a device for detecting a deformation of a component, which is easily adapted in shape to the corresponding component and is mountable independently of external interference.

The device may have a deformable hollow body arrangement having at least one orifice area, the hollow body arrangement being assigned to the vehicle component as a deformation indicator, and the device may have at least one sensor device, which is situated in the particular orifice area for measuring an air flow which corresponds to the deformation of the hollow body arrangement.

Deformation of the automotive component may thus be detected on the basis of the deformation of the particular deformable hollow body arrangement. Air flow occurring due to the deformation of the hollow body arrangement may be measured by at least one sensor device.

With the device according to the present invention, because of the simple design, an inexpensive and nevertheless durable device may be created, which is highly adaptable in shape to certain components and is mountable so that it is protected from external interference.

According to an exemplary embodiment, the hollow body arrangement may be designed as a plastically or elastically deformable container, for example, as a plastic container. Such a container may be inexpensive to manufacture and have a satisfactory lifetime.

According to another exemplary embodiment, the hollow body arrangement may be mountable on the component by using at least one fastening device, e.g., a fastening eye, so that the at least one fastening device does not prevent deformation of the hollow body arrangement. Thus, the device may be easily mounted on and/or removed from components of different shapes.

According to another exemplary embodiment, the orifice area of the hollow body arrangement may be situated so that it is protected from external air currents. In the automotive area, this may be implemented by providing the device and the particular orifice area in an interior panel, e.g., a door panel of a vehicle. External air flows, e.g., in closing a door, may thus be kept away from the sensor device and may not be detected by it. This may increase the measurement accuracy of the corresponding sensor devices.

According to another exemplary embodiment, the component itself may be designed as a deformable hollow body arrangement. For example, the interior of an automotive door may form the hollow body arrangement, and an orifice area toward the interior of the vehicle may be created. Then it may not be necessary to install an additional deformable body.

According to another example refinement, the at least one sensor device may be designed as an air flow sensor or as an air velocity sensor. Both types are suitable in principle for detecting an air flow that occurs due to deformation.

According to another exemplary embodiment, several sensor devices based on the same principle or different principles may be combined. The individual measured data of the sensor devices may be analyzed in one analyzer unit and compared with threshold values or signal patterns stored in a memory device. If, on analysis, the measurement data of one sensor device or all sensor devices reveal air flow values in the orifice area of the hollow body arrangement which exceed predetermined threshold values or correspond to predetermined signal patterns, then a vehicle occupant safety application may be activated. Thus, the reliability of such a system may be increased with each additional sensor device.

DETAILED DESCRIPTION

In the figures, the same reference numbers denote the same components or those having the same function.

Figure 1:
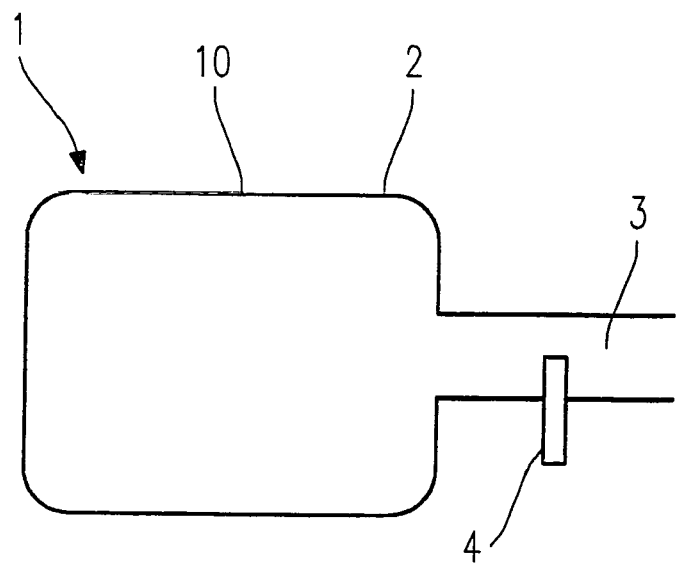
FIG. 1 illustrates a schematic diagram of a device for detecting a deformation according to a first exemplary embodiment of the present invention.

FIG. 1 illustrates a schematic diagram of a device 1 for detecting a deformation of a component.

The device 1 is composed of a deformable hollow body arrangement 2 representing any desired component 10 in a motor vehicle, for example, according to the first exemplary embodiment. This may be a two-shell vehicle door or the like.

According to the first exemplary embodiment, hollow body arrangement 2 has an orifice area 3 in which is mounted a conventional air flow sensor or air velocity sensor 4. Orifice area 3 may be situated in such a way that it is protected from external air flows and its measured data is not influenced by external interfering factors. For example, in the present exemplary embodiment, the orifice area may be provided toward the interior of the vehicle.

With sensor 4, it is possible to detect a sudden outflow of air out of compressed container 2 as well as a certain influx of air into inflated container 2. The type of deformation or impact may be specified in greater detail on the basis of the direction of air flow.

Figure 2:
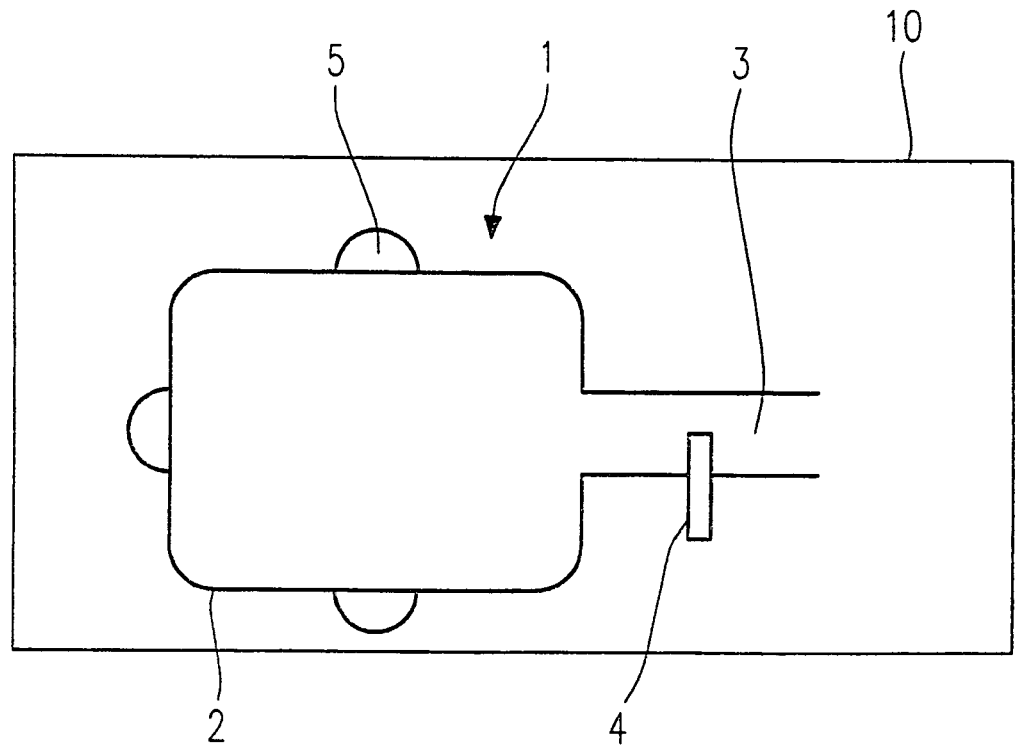
FIG. 2 illustrates a schematic diagram of a device for detecting a deformation according to a second exemplary embodiment of the present invention.

FIG. 2 shows a schematic diagram of a device 1 for detecting a deformation according to a second exemplary embodiment of the present invention.

Hollow body arrangement 2 is designed here as an elastically deformable container 2, e.g., a plastic container, and may be mounted using fastening eyes 5 on a component 10. Fastening eyes 5 may not prevent expansion or compression of deformable container 2.

Thus, when suitably mounted on the component, the container undergoes a deformation which corresponds to that of component 10 on which it is mounted using fastening eyes 5. Inferences regarding the type of accident or impact involving the vehicle which has led to deformation of component 10, i.e., container 2, may be drawn on the basis of the air flowing in or out through orifice area 3.

On the basis of FIG. 3, the sequence for detecting deformation of a component 10 and for activating a suitable safety application 15 is described below.

Figure 3:
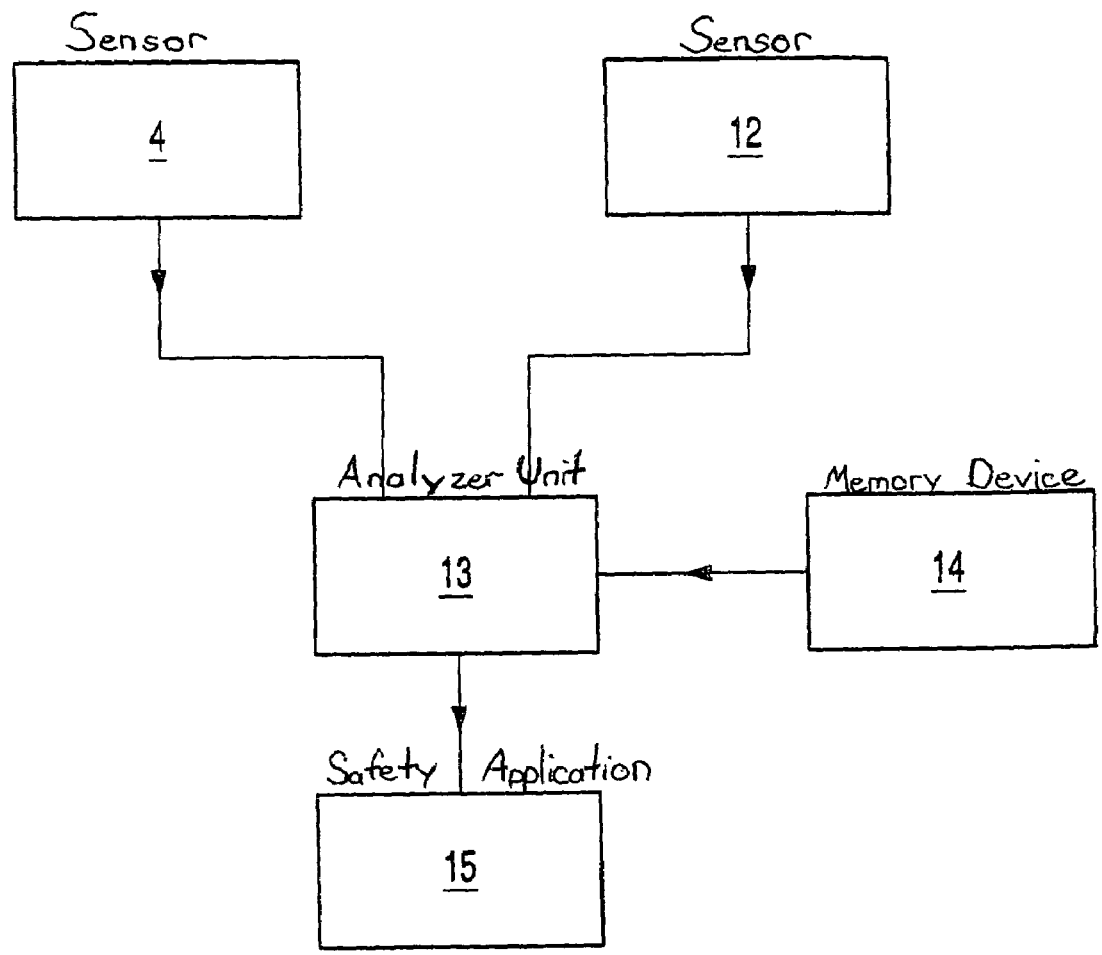
FIG. 3 illustrates a schematic diagram of an exemplary embodiment of the sequence for activation of a vehicle occupant safety application when a deformation is detected.

The system according to the exemplary embodiment illustrated in FIG. 3 has two sensor devices 4, 12. Sensor devices 4, 12 may be based on the same sensor principle or different sensor principles; for example, sensor device 4 may be designed as an air flow sensor, and sensor device 12 may be designed as a pressure sensor.

Sensor devices 4, 12, as described above, may detect a deformation of the component, for example, directly (see first exemplary embodiment according to FIG. 1) or indirectly (see second exemplary embodiment according to FIG. 2).

The measured data thus compiled may be transmitted to an analyzer unit 13 which is connected to sensor devices 4, 12 and analyzes the data.

A memory device 14 in which predetermined threshold values or signal patterns are stored may be connected to analyzer unit 13. Analyzer unit 13 analyzes the measured data acquired and compares it with the threshold values stored in memory device 14. If the measured values exceed the predetermined threshold values or if the variation of the measured data over time resembles, is equal to, or exceeds a stored signal pattern, then a safety application 15 may be activated by analyzer unit 13 on corresponding safety application 15.

The threshold values may represent, for example, a predetermined pulse, a predetermined air flow speed, a predetermined air flow difference, or the like.

The signal patterns may represent, for example, a predetermined signal characteristic over time, a predetermined characteristic of the signal magnitude, or any desired mathematical links of signal magnitude and variation over time.

The device according to the present invention may also provide that total deformation, e.g., rupturing of the arrangement, may be virtually ruled out because of the orifice area. Thus, in the event of an accident, the measurement device may be additionally protected from total deformation and may supply additional measurement signals.

Furthermore, the device may have a long life, may be inexpensive to manufacture and may be easily integrated into an existing system.

Although the present invention has been described above on the basis of several exemplary embodiments, it is not limited to those exemplary embodiment and may be modified in a variety of ways.

For example, more than two sensor devices may be combined and analyzed for additional measurement accuracy. Depending on the field of application, it is possible to decide whether the component per se is the corresponding deformable hollow body or whether a hollow body arrangement is to be mounted on the corresponding component.

What is claimed is:

1. A device for detecting a deformation of a component, comprising:
   a deformable hollow body arrangement having at least one orifice area, the deformable hollow body being assigned to the component as a deformation indicator; and
   at least one sensor device disposed in the at least one orifice area and configured to measure an air flow corresponding to the deformation of the deformable hollow body arrangement,
   wherein the component is an automotive component and the at least one sensor device is configured as one of an air flow sensor and an air velocity sensor.

2. The device according to claim 1, wherein the deformable hollow body arrangement is a plastically or elastically deformable container.

3. The device according to claim 2, wherein the deformable hollow body arrangement is a plastic container.

4. The device according to claim 1, further comprising:
   at least one fastening device disposed on the component, wherein the deformable hollow body is configured to be mounted using the at least one fastening device and wherein the at least one fastening device is configured to accommodate the deformation of the deformable hollow body.

5. The device according to claim 4, wherein the fastening device is a fastening eye.

6. The device according to claim 1, wherein the orifice area of the deformable hollow body arrangement is mounted so as to be protected from external air flows.

7. The device according to claim 1, wherein the deformable hollow body arrangement is provided in an interior panel of a vehicle.

8. The device according to claim 7, wherein the deformable hollow body arrangement is provided in a door of the vehicle.

9. The device according to claim 1, wherein the component is the deformable hollow body arrangement.

10. The device according to claim 1, wherein the at least one sensor includes a plurality of sensors of a same type.

11. The device according to claim 1, wherein the at least one sensor includes a plurality of sensors of different types.

12. The device according to claim 1, further comprising:
a safety application configured to be activated if a measured data of the at least one sensor device yields an air flow value in the orifice area of the deformable hollow body arrangement having a magnitude exceeding a predetermined threshold value.

13. The device according to claim 1, further comprising:
a safety application configured to be activated if a measured data of the at least one sensor device yields an air flow value in the orifice area of the deformable hollow body arrangement having a variation over time resembling a predetermined signal pattern.

14. The device according to claim 1, further comprising:
a safety application configured to be activated if a measured data of the at least one sensor device yields an air flow value in the orifice area of the deformable hollow body arrangement having a variation over time one of equal to or exceeding a predetermined signal pattern.

15. A method of detecting a deformation of a component and activating a safety application, comprising:
measuring a deformation of a hollow body arrangement assigned to the component as a deformation indicator using at least one sensor device, the hollow body arrangement including at least one orifice area, wherein the at least one sensor device is configured as one of an air flow sensor and an air velocity sensor;
analyzing measured data of the at least one sensor device using an analyzer unit; and
activating the safety application if the measured data of the at least one sensor device indicates a deformation of the hollow body arrangement has occurred.

16. The method according to claim 15, wherein the component is an automotive component.

17. The method according to claim 15, wherein the safety application is a vehicle occupant safety application, the vehicle occupant safety application being activated if the measured data of the at least one sensor device yields an air flow values in the orifice area of the hollow body arrangement having a magnitude exceeding a predetermined threshold value.

18. The method according to claim 15, wherein the safety application is a vehicle occupant safety application, the vehicle occupant safety application being activated if the measured data of the at least one sensor device yields air flow values in the orifice area of the hollow body arrangement having a variation over time resembling a predetermined signal pattern.

19. The method according to claim 15, wherein the safety application is a vehicle occupant safety application, the vehicle occupant safety application being activated if the measured data of the at least one sensor device yields air flow values in the orifice area of the hollow body arrangement having a variation over time one of equal to or exceeding a predetermined signal pattern.

20. The method according to claim 15, wherein the hollow body arrangement is a plastically or elastically deformable container.

21. The method according to claim 20, wherein the hollow body arrangement is a plastic container.

22. The method according to claim 15, further comprising:
mounting the hollow body arrangement on the component using at least one fastening device, wherein the at least one fastening device is configured to allow a deformation of the hollow body arrangement.

23. The method according to claim 22, wherein the at least one fastening device is a fastening eye.

24. The method according to claim 15, wherein the orifice area of the hollow body arrangement is arranged so as to be protected from external air flows.

25. The method according to claim 15, wherein the hollow body arrangement is provided in an interior panel of a vehicle.

26. The method according to claim 25, wherein the hollow body arrangement is provided in a door of the vehicle.

27. The method according to claim 15, wherein the component is the hollow body arrangement.

28. The method according to claim 15, wherein the at least one sensor includes a plurality of sensors, the method further comprising:
combining several of the plurality of sensors of a same type or of a different type.

* * * * *